(12) United States Patent
Kögel et al.

(10) Patent No.: US 7,525,295 B2
(45) Date of Patent: Apr. 28, 2009

(54) SWITCHING DC-DC CONVERTER WITH PARALLEL SWITCHES

(75) Inventors: Reinhard Kögel, Brigachtal (DE); Jean-Paul Louvel, Brigachtal (DE)

(73) Assignee: Thomson Licensing, Boulogne-Billancourt (FR)

( * ) Notice: Subject to any disclaimer, the term of this patent is extended or adjusted under 35 U.S.C. 154(b) by 195 days.

(21) Appl. No.: 11/168,963

(22) Filed: Jun. 28, 2005

(65) Prior Publication Data
US 2006/0022654 A1   Feb. 2, 2006

(30) Foreign Application Priority Data
Jun. 30, 2004   (EP)   ................... 04015302

(51) Int. Cl.
*G05F 1/00*   (2006.01)
(52) U.S. Cl. .................. 323/282; 323/222; 323/225; 323/272; 323/283
(58) Field of Classification Search ................ 323/222, 323/225, 272, 282, 283
See application file for complete search history.

(56) References Cited

U.S. PATENT DOCUMENTS

| | | | | |
|---|---|---|---|---|
| 3,978,393 A | * | 8/1976 | Wisner et al. | ............... 323/272 |
| 4,430,608 A | | 2/1984 | Nesler | |
| 5,731,731 A | | 3/1998 | Wilcox et al. | |
| 6,452,366 B1 | | 9/2002 | Hwang | |
| 6,469,481 B1 | * | 10/2002 | Tateishi | ...................... 323/282 |
| 7,071,662 B2 | * | 7/2006 | Hsu et al. | .................... 323/272 |

OTHER PUBLICATIONS

Apr. 2004 XP002309277 MC34063A, MC33063A, NCV33063A 1.5 A, Step-Up/Down/Inverting Switching Regulators.

* cited by examiner

*Primary Examiner*—Akm E Ullah
*Assistant Examiner*—Arun Williams
(74) *Attorney, Agent, or Firm*—Robert D. Shedd; Harvey D. Fried

(57) ABSTRACT

The switching DC-DC converter comprises an inductor, a diode, a transistor and an integrated control circuit with an output switch, the output switch and the diode being coupled to the inductor for providing a DC output voltage. The transistor is coupled with a current input to an input voltage, with a control input to a current input of the output switch, and with a current output to a current output of the output switch.

15 Claims, 2 Drawing Sheets

US 7,525,295 B2

SWITCHING DC-DC CONVERTER WITH PARALLEL SWITCHES

This application claims the benefit, under 35 U.S.C. § 119 of European Patent Application 04015302.5, filed Jun. 30, 2004.

FIELD OF THE INVENTION

The present invention relates to a switching DC-DC converter comprising an integrated control circuit for the generation of a stabilized DC output voltage. The DC-DC converter comprises in particular an inductor and a diode for operating as a step-down converter, a step-up converter or a voltage inverting converter.

BACKGROUND

For generating a stabilized DC output voltage, more and more switching regulators are used for the DC-DC conversion, because of the high efficiency of the switched mode power supplies. New equipment designs and low parts costs with a simple design make the use of switching regulators more pronounced over that of linear regulators. A further advantage of the switching regulator is the increased application flexibility of the output voltage, which can be less than, greater than, or of opposite polarity to that of the input voltage.

When using a monolithic integrated control circuit, only a few circuit parts are required for designing a DC-DC converter. Control circuits of this kind comprise in particular an internal temperature compensated reference voltage, a comparator, a controlled duty cycle oscillator with an active current limit circuit, a driver stage and a high current output switch. A known monolithic control circuit of this kind is for example the integrated circuit MC34063 manufactured by ON Semiconductor Components Industries.

A DC-DC converter of this kind, operating as a down-converter, is shown in FIG. 1. The DC-DC converter comprises an inductor L1, a diode D1 and an integrated control circuit IC1, for providing a stabilized DC output voltage U2. The inductor L1 is in particular a coil. The control circuit IC1 is in this application the integrated circuit MC34063A.

The control circuit IC1 comprises a reference voltage generator RG and a comparator CO for the regulation of the output voltage U2. It comprises further an oscillator OS, having an input terminal 3, to which a capacitor C3 is coupled for defining the oscillation frequency of the oscillator OS. The control circuit IC1 comprises further a logic circuit LC and an output stage with a driver transistor Q2 and an output switch Q1, the transistor Q2 driving the output switch Q1. The comparator CO and the oscillator OS are coupled to the logic circuit LC for operating the output stage.

The control circuit IC1 operates with an input voltage U0, coupled to current inputs 1, 6, 7 and 8 of the control circuit IC1. An overload protection is provided for the DC-DC converter via a low resistance resistor R1 coupled to terminals 6 and 7 of the control circuit IC1. The output switch Q1 is coupled with a current input, terminal 1, to the input voltage U0 and with a current output, terminal 2, to a first terminal of the coil L1 for providing a voltage U1 for the operation of the coil L1.

A freewheeling diode D1 is coupled between ground and terminal 2. The coil L1 is coupled with a second terminal to an output capacitor C2, which provides a smoothing of the output voltage U2. The voltage U2 is coupled via a voltage divider, resistors R3 and R2, and terminal 5 to the comparator CO of the control circuit IC1, for providing a feedback loop FB for the regulation of the DC-DC converter.

The circuit as described above is known and similar circuits are suggested in application sheets of IC manufacturers. Detailed application data for the MC34063 are available by ON Semiconductor Components under HTTP://onsemi.com in a data sheet, Rev. 10, April 2002. According to the data sheet, the maximum permissible switch current for the MC34063 is 1.5 A.

For peak currents higher than 1.5 A, the DC-DC converter has to include an external power transistor, as shown in FIGS. 2 and 3. In FIG. 2 a npn-transistor T1 is coupled with a current input to the input voltage U0 and to the terminal 1 of the integrated circuit IC1. The base terminal of the transistor T1 is coupled to the terminal 2 of the integrated circuit IC1 and the current output is coupled to the inductor L1. The output switch Q1 operates therefore as a driver stage for the transistor T1. The regulation loop of the DC-DC converter, not shown, corresponds to the regulation loop of FIG. 1.

A resistor R4 couples the base terminal of transistor T1 to ground. When the output switch Q1 is blocked, the transistor T1 is blocked also. When Q1 switches through, the transistor T1 switches through respectively, the output switch Q1 providing therefore only the base current for the transistor T1. The current through the transistor T1 is therefore correspondingly higher depending on the current amplification factor of the transistor T1. Therefore, all the current for operating the inductor L1 is provided by the current output of the transistor T1, and hence a power transistor has to be used in accordance with the required output power.

In FIG. 3 a DC-DC converter is shown, which uses a pnp-transistor T2 for providing a higher output power. The current input of the transistor T1 is the emitter, which is coupled in this embodiment to the input voltage U0. The current output, the collector, is coupled to the inductor L1. A resistor R5 couples the base terminal of transistor T2 to the input voltage U0 and a resistor R6 to the terminal 1 of the integrated circuit IC1. The terminal 2 of the integrated circuit IC1 is coupled to ground.

The operation of the DC-DC converter shown in FIG. 3 is similar to the operation of the DC-DC converter of the FIG. 2: When the output switch Q1 of the integrated circuit IC1 switches through, a current flows through the emitter and base of transistor T2 through switch Q1, switching through therefore transistor T2. When Q1 is blocked, the transistor T2 is blocked also, because then the voltage present at the base of transistor Q2 is high.

Corresponding applications for step-up converters and voltage inverting converters are also described in the data sheet for the integrated circuit MC34063.

SUMMARY OF THE INVENTION

The switching DC-DC converter according to the invention comprises an inductor, a diode and an integrated control circuit with an output switch for generating an output voltage. The output switch and the diode are coupled to the inductor for operating for example as a step-down converter, a step-up converter or a voltage inverting converter. A transistor is coupled with a control input to a current input of the output switch, with a current input to an input voltage of the DC-DC converter, and with a current output to a current output of the output switch.

In another aspect of the invention a transistor is coupled in parallel with the output switch of the control circuit for providing an additional current for the operation of the inductor. The inductor is therefore operated with the sum of two currents, one provided by the transistor and the second by the output switch of the integrated control circuit.

The ratio between the two currents can be adjusted advantageously via an impedance, which is coupled between the current input and the control input of the transistor, for providing a current to the current input of the output switch of the integrated control circuit and for providing a control current for the transistor. The value of the impedance is chosen such, that in a low power range the voltage across the impedance is not sufficient for opening the transistor. The current for the operation of the inductor is then provided totally by the output switch.

Only in a power range above or slightly below the specification of the integrated control circuit, the voltage drop across the impedance is sufficient to open the transistor, therefore extending the output power range of the DC-DC converter to a power above the specified current of the integrated control circuit. In particular, in a medium power range a low power transistor type can be used, which is much cheaper than a power transistor. Advantageously, the transistor may start conducting also already in a power range, in which the current through the output switch is below the specified maximum current, for reducing the heat stress of the integrated control circuit.

BRIEF DESCRIPTION OF THE DRAWINGS

Preferred embodiments of the invention are explained in more detail with regard to a schematic drawing. The drawings show.

Figure 1:
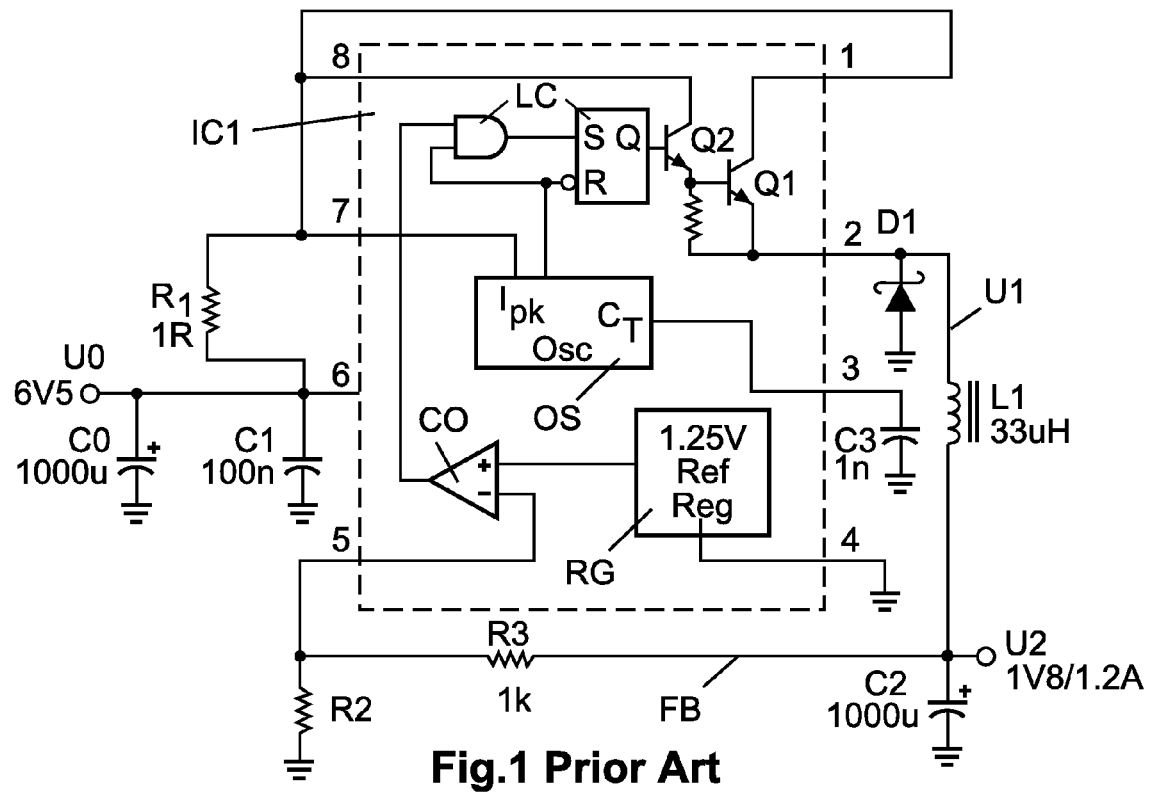
FIG. 1 a prior art switching DC-DC converter with an integrated control circuit, the converter operating as a step-down converter, FIG. 2 a prior art step-down converter, comprising an external npn-transistor for providing a higher output current, FIG. 3 a prior art step-down converter comprising an external pnp-tranisistor, and FIG. 4 a step-down converter with an external transistor in accordance with the invention.

According to the invention, a transistor T3 is coupled in parallel with the output switch Q1 of the control circuit IC1 for providing an additional current I2 for the operation of the inductor L1. The control circuit IC1 comprises an output switch Q1, which provides a current I1 for the operation of the inductor L1. The current I2 from the transistor T3 is adjusted via an impedance R7, in this embodiment a resistor, which is coupled between the current input and the control input of the transistor T3. The currents I1 and I2 are summed up in a node 10, ahead of the inductor L1.

The operation of the DC-DC converter is as follows: When the output switch Q1 is switched through by the transistor Q2, a current flows through the impedance R7 and the output switch Q1, leading to the current I1. The resistor R7 has a resistance value of 0.75 Ohm, which leads for a current below 1 Ampere to a voltage drop of below 0.75 Volts. Therefore, for a current I1 below 1 Ampere, the transistor T3 is more or less closed. For a current above 1 Ampere, the voltage drop across resistor R7 is above 0.75 Volts, when the output switch Q1 is switched through, which leads to a switching through of the transistor T3. Therefore, for a current above about 1 Ampere, an additional current I2 is provided for the operation of the inductor L1.

Hence, the heat dissipation of the integrated circuit IC1 is reduced for a higher power range corresponding to a current of above 1 Ampere, when using a transistor T3 in parallel to the output switch Q1. Further, for a power range corresponding to a current of about 1.5 Ampere, the main part of the output current is provided by the control circuit IC1. Therefore, in this range the heat dissipation of the transistor T3 is still low, which allows using a low-cost transistor, for example the type BC327. This transistor is specified for a maximum peak current of 1 A and a maximum power dissipation of 0.6 W.

For a further extension of the output power, several low cost pnp-transistors may be coupled in parallel with the transistor T3, which are still cheaper than a single power transistor. In this application, the additional transistors are each coupled with the current input to the input voltage U0, with the control input to the terminal 1 and with the current output to the terminal 2 of the integrated circuit IC1.

Figure 2:
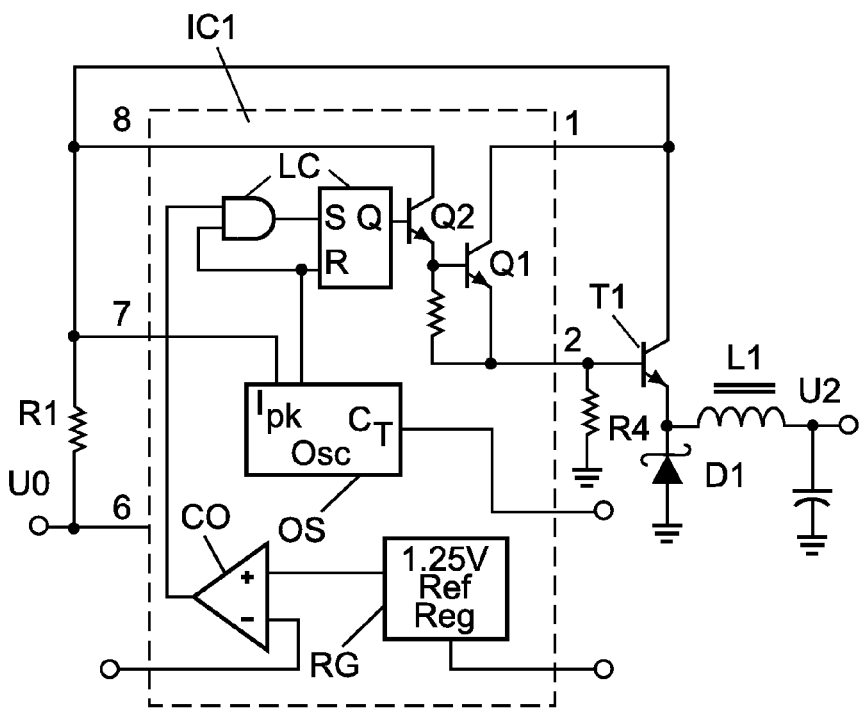
Figure 3:
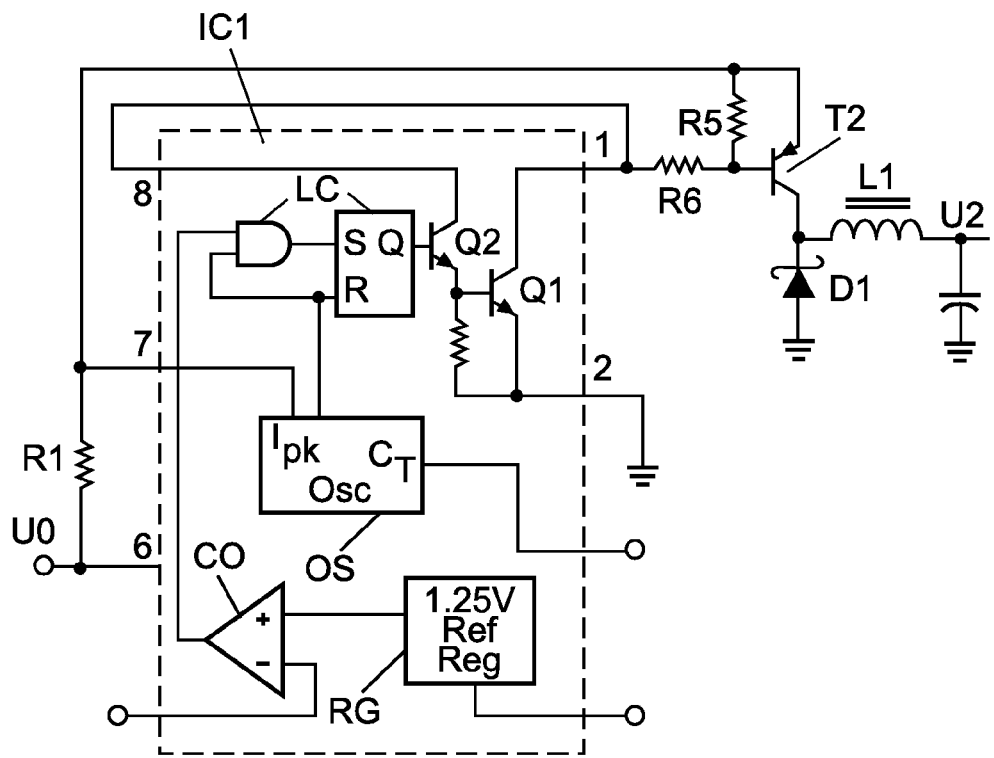
Figure 4:
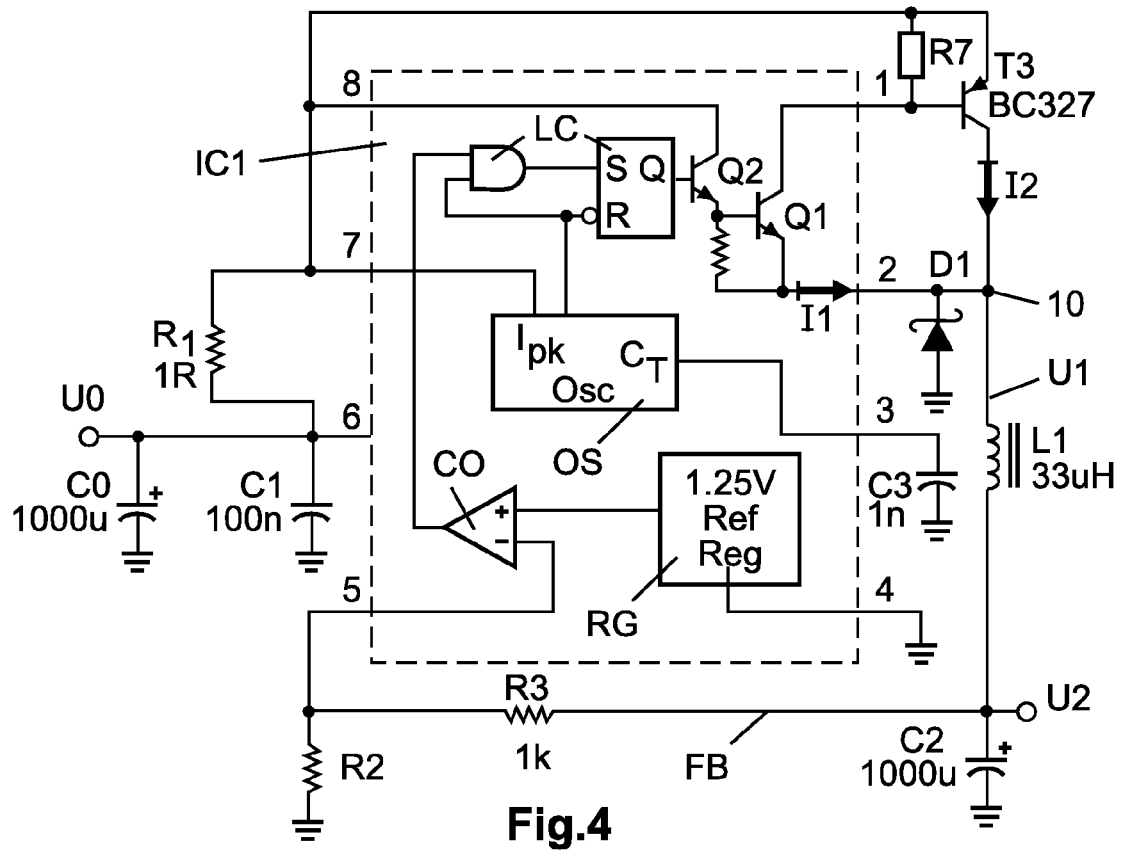
In FIG. 4 a switching DC-DC converter is shown comprising an integrated control circuit IC1, to which an input voltage U0 is coupled, supply voltage inputs 1, 6, and 8. The control circuit IC1 is for example a low cost integrated circuit MC34063A. The DC-DC converter comprises further a diode D1, an inductor L1, in this embodiment a coil, and a feedback loop FB, which are arranged for operating as a step-down converter. The DC-DC converter provides an output voltage U2, which is stabilized via the feedback loop FB. The circuit as described so far corresponds to the DC-DC converter as shown in FIG. 1.

The DC-DC converter as shown in FIG. 4 therefore has the advantage, that a smaller external transistor can be used as compared with the circuits of FIGS. 2 and 3, which leads to a DC-DC converter with reduced costs and reduces in particular the heat stress for the integrated control circuit in a medium power range.

The present invention is not limited to the embodiments as described with regard to the FIG. 4, and various available modifications come possible for those skilled in the art without departing from the scope of the invention.

In particular, any other transistor may be used for the transistor T3, for example also a field effect transistor, or any other controllable switching element. The invention is also applicable to step-up converters and voltage inverting converters.

The invention claimed is:
1. Switching DC-DC converter comprising
an inductor having a first terminal and a second terminal
an output capacitor coupled to the second terminal,
a diode coupled to the first terminal,
an integrated control circuit including an integrated output switch having a current input and a current output with a specified output current range, said current input being coupled with an input voltage and said current output being coupled to the first terminal of the inductor, and
a transistor coupled with a current input to said input voltage, with a control input coupled to the current input of the output switch, and with a current output coupled to the current output of the output switch, said output switch providing a first current and said transistor providing a second current being added with said first current at a nod coupled to the first terminal of said inductor configured for providing a DC output voltage at said output capacitor, and
an impedance coupled with one end to the input voltage and the current input of the transistor and connected with a second end with the control input of the transistor and with the current input of the output switch for adjusting the current ratio between said first and second currents by providing a voltage drop between the current input and the control input of the transistor, for extending an output current range of the switching DC-DC converter above the specified output current range of said integrated control circuit.

2. Switching DC-DC converter in accordance with claim 1, wherein the resistance value of the impedance is selected such that the transistor is blocking in a lower power range, so that the current for the operation of the inductor is only provided by said integrated output switch.

3. Switching DC-DC converter in accordance with claim 1, wherein the resistance value of the impedance is selected such that the transistor is conducting in a higher power range.

4. Switching DC-DC converter in accordance with claim 1, wherein the transistor is a npn-transistor, a pnp-transistor or a field-effect transistor with a maximum peak current of 1 Ampere.

5. Switching DC-DC converter in accordance with claim 1, wherein the inductor, the diode and the integrated control circuit are arranged for operating as a step-down converter, a step-up converter or a voltage inverting converter.

6. Switching DC-DC converter in accordance with claim 5, wherein the DC-DC converter comprises further a feedback loop for generating a stabilized DC output voltage.

7. Switching DC-DC converter in accordance with claim 6, wherein the control circuit is a monolithic control circuit comprising an internal reference voltage generator, a comparator, a controlled duty cycle oscillator, a logic circuit coupled to the integrated output switch, and an input of the comparator being coupled with a reference voltage of the reference voltage generator.

8. Switching DC-DC converter comprising
an inductor having a first terminal and a second terminal,
a diode coupled to the first terminal,
an output capacitor coupled to the second terminal,
a transistor, and
an integrated control circuit including an integrated output switch configured for providing a first current with a specified output current range of said integrated control circuit, the integrated output switch and the diode being coupled to the first terminal of the inductor for providing a DC output voltage, wherein a current input and a current output of the transistor are coupled in parallel to a current input and a current output of the integrated output switch and a control input of the transistor is connected to the current input of the integrated output switch and the current output of the transistor is connected to the current output of the integrated output switch, for providing an additional, second current being added with said first current at a node coupled to the first terminal of the inductor configured for providing a DC output voltage at said output capacitor, and wherein said transistor is switched through when said output switch is switched through, for extending an output current range of the switching DC-DC converter above said specified output current range of said integrated control circuit.

9. Switching DC-DC converter in accordance with claim 8, wherein an impedance is coupled between an input voltage and the control input of the transistor for defining a current through the transistor.

10. Switching DC-DC converter in accordance with claim 9, wherein the resistance value of the impedance is selected such that the transistor is blocking when the current of the integrated output switch is within the specification of the control circuit.

11. Switching DC-DC converter in accordance with claim 9, wherein the resistance value of the impedance is selected such that the transistor is conducting in a higher power range for providing a current to the inductor, which is above the specification of the integrated control circuit.

12. Switching DC-DC converter in accordance with claim 8, wherein the transistor is a npn-transistor, a pnp-transistor or a field-effect transistor with a maximum peak current of 1 Ampere.

13. Switching DC-DC converter in accordance with claim 8, wherein the inductor, the diode and the integrated control circuit are arranged for operating as a step-down converter, a step-up converter or a voltage inverting converter.

14. Switching DC-DC converter in accordance with claim 13, wherein the DC-DC converter comprises further a feedback loop for generating a stabilized DC output voltage.

15. Switching DC-DC converter in accordance with claim 14, wherein the control circuit is an integrated monolithic control circuit comprising an internal reference voltage generator, a comparator, a controlled duty cycle oscillator, a logic circuit coupled to the integrated output switch, and an input of the comparator being coupled with a reference voltage of the reference voltage generator.

* * * * *